Oct. 27, 1959 H. HAMER 2,910,549
STABILIZED DIRECT COUPLED AMPLIFIER
Filed July 1, 1955
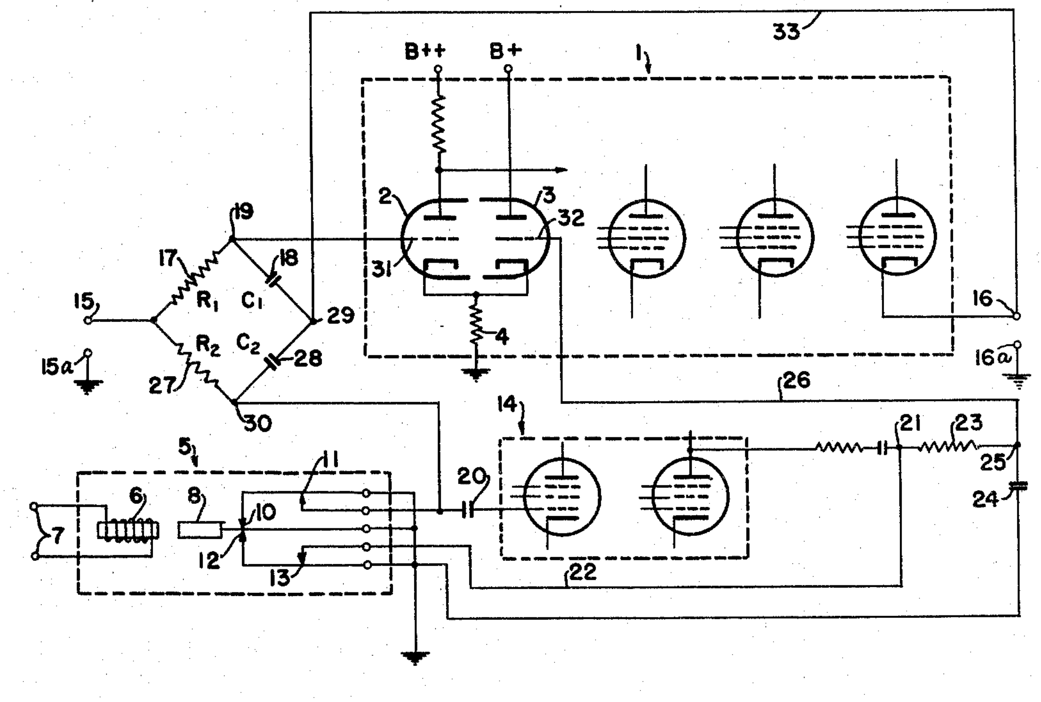
INVENTOR
HOWARD HAMER
BY
Pennie, Edmonds, Morton, Barrows & Taylor
ATTORNEYS 2,910,549

STABILIZED DIRECT COUPLED AMPLIFIER

Howard Hamer, West Long Branch, N.J., assignor to Electronic Associates, Inc. Long Branch, N.J., a corporation of New Jersey Application July 1, 1955, Serial No. 519,372

4 Claims. (Cl. 179—171)

This invention relates to electronic analog integrators and more particularly to means for eliminating drift in such integrators.

An important component of apparatus for electronic analog computation is the electronic integrator. In its most common form an analog integrator comprises a high gain direct coupled amplifier utilizing a capacitive negative feedback path. Unless special precautions are taken, such an integrator will be subject to drift which I define as any change in output voltage not caused by variations in the applied signal voltage. This drift might be due to many factors, the most important and common of which are amplifier unbalance and input current.

One means of compensating an integrator for drift due to unbalance utilizes a so-called automatic balancing circuit which comprises a modulator, an alternating current amplifier, a demodulator and a filter connected in cascade in the order given. This circuit is connected to the original circuit so that it has an input in common with the direct coupled amplifier and its output is connected into the direct coupled amplifier so that low frequency error voltage or drift is amplified by the modulated carrier channel and fed back to the direct coupled amplifier in a manner which annuls the effect of the original offset voltage. This technique will reduce to a minimum the undesirable effects of drift due to random changes in components of the direct coupled amplifiers. However, the drift due to input current in the direct coupled amplifier is not reduced by the addition of an automatic balancing circuit.

There are three methods which have been commonly used to reduce the drift due to grid current in the input stage of the direct coupled amplifier of an electronic analog integrator. One method is to increase the value of the capacitive feedback path of the direct coupled amplifier. However, this capacitor must be of very high quality, and high-quality, precision capacitors of large capacity are extremely expensive; so this method is undesirable.

A second method is to insert a grid current blocking capacitor in the input circuit to the first stage of the direct coupled amplifier and to use a separate grid return resistor. With this method the automatic balancing circuit is relied upon to maintain good response at D.-C. and low frequencies while the direct coupled amplifier handles the high frequency components of the signal voltage exclusively. The principal objection to this second method is that the grid current blocking condenser is easily charged through the input stage of the direct coupled amplifier to values which may effectively block the entire integrator for extended periods of time.

A third method of drift reduction due to input current utilizes a bleeder resistance from the direct coupled amplifier input to an external power supply. This, in effect, supplies the input current from a source other than the integrating condenser and thus reduces drift due to input current. However, this technique presupposes that the input current remains constant which is rarely the case.

To adapt this technique to common conditions of operation of the integrator requires that some provision be made for continuously adjusting the bleeder resistor. Obviously, this requires difficult and cumbersome additions to the apparatus.

I have invented a new electronic analog integrator circuit utilizing an automatic balancing circuit so as to reduce the drift due to all active sources including those discussed above. According to my invention an electronic analog integrator, including a direct coupled operational amplifier having an integrating network and an automatic balancing circuit for the direct coupled amplifier, is provided with a passive impedance network for comparing and detecting components in the output voltage of the operational amplifier which are not proportionally related to the signal voltage to be integrated. The input to the direct coupled amplifier is connected to the integrating network while the input to the automatic balancing circuit is connected to the passive network. As is well known in the art, a passive impedance network is one which contains no source of energy.

In the following specification I give a detailed description of a particular embodiment of my invention. In the course of the specification reference is made to the accompanying drawing which is a schematic diagram of an electronic analog integrator circuit.

In the drawing there is represented symbolically at 1 a conventional direct coupled amplifier of suitable design. This amplifier is provided with a primary input stage 2 which is a triode vacuum tube. The amplifier is also provided with an auxiliary input stage 3 which is also a triode vacuum tube. The primary and auxiliary input stages are cathode coupled through the common cathode resistance 4 to ground. It is customary that the auxiliary stage immediately follow the primary stage as shown, but this is not essential if sufficient gain is included in the subsequent stages of the same amplifier. Fundamentally, the two control electrodes may comprise any electrodes which sufficiently influence the amplifier gain, or output.

The automatic balancing circuit comprises the synchronous vibrator 5 having a field winding 6 supplied with alternating current of suitable frequency, e.g. 400 cycles, through terminals 7. The synchronous vibrator has an armature 8 for actuating a pair of contact points 10, 11 and another pair of contacts 12, 13. The automatic balancing circuit also includes a conventional A.-C. amplifier 14, symbolically represented.

The input terminal pair for the integrator are represented at 15, **15*a* and the output terminal pair are shown at 16, 16*a*. Feedback connection 33** is included in the integrating network.

To form an analog integrator circuit the elements described above are connected in the following manner. An input resistance 17, also designated as $R_1$, is connected between the input terminal 15 and junction 19 which is connected to the control grid 31 of the primary input stage 2. A capacitive feedback element 18, also designated as $C_1$, is connected between junctions 29 and 19, junction 29 being connected by conductor 33 to the output terminal 16. The combination of these elements forms an integrating network well known in the art.

In a conventional integrator the control grid 31 would be connected to junction 19, but the input signal to the automatic balancing circuit would also be taken from the junction 19 between the elements $R_1$ and $C_1$, i.e. resistance 17 and capacitance 18, and connected to the synchronous vibrator 5 where the pair of contacts 10, 11 modulate the varying D.-C. signal to produce a pulsating D.-C. signal having an amplitude proportional to the voltage at the junction. This pulsating voltage would then be impressed on the control grid of the first stage of the A.-C. amplifier 14 through the coupling capacitor 20, as in the present case. After amplification, the pulsating voltage appears at the terminal 21 where it is connected through conductor 22 to the contacts 12, 13 of the synchronous vibrator 5. Inasmuch as these latter contacts operate 180° out of phase with the contacts 10, 11, the pulsating voltage at the terminal 21 is reconverted to a varying D.-C. voltage proportional to the voltage at the junction between resistance 17 and capacitor 18. That is to say, it is demodulated.

A filter network comprising the resistance 23 and capacitor 24 is provided to eliminate undesired high frequency components of the demodulated voltage. The filtered voltage is taken from the terminal 25 through the conductor 26 to the control grid 32 of the auxiliary input stage 3 of the direct coupled amplifier.

The conventional integrator which I have just described, including the usual connection of the input of the automatic balancing circuit to the junction 19 between resistance 17 and capacitance 18 is capable of reducing the effects of drift due to variations in components of the circuit, i.e. aging, temperature differences, etc., to a very high degree. Circuits of this kind have proved to be of great value in the computer art. However, it can be said that a conventional automatic balancing circuit which provides correction for these effects does not sense differences of potential at the junction 19 between resistance 17 and capacitance 18 due to grid current flowing in the input circuit and therefore the automatic balancing circuit is incapable of correcting errors introduced by this source. Prior to my present invention means for overcoming the effects of grid current flowing in the input stage of the direct coupled amplifier have been difficult and expensive.

I have found that very substantial improvements in the accuracy of an integrator circuit including the elimination of effects of grid current can be obtained in the following manner which includes the addition of a passive network of impedance elements to the standard integrator circuit. This passive network is arranged to compare the signal voltage at the terminal 15 with the output voltage at the terminal 16 and to detect all variations in the latter which are not attributable to variations in the former. In the particular embodiment illustrated this passive network comprises an input resistance $R_2$ at 27 and a capacitance $C_2$ at 28 connected in the order named between the input terminal 15 and the output terminal 16 to form in effect a resistance-capacitance bridge with the resistance 17 and capacitance 18 of the integrating network. While, in accordance with my invention the control grid 31 of the primary input stage 2 is connected at the junction 19 between the elements 17 and 18, the input to the automatic balancing circuit is now connected to the intermediate junction 30 between these new elements 27, 28, rather than to the intermediate junction 19 as in the conventional integrator circuit.

In this new circuit, current flowing in the grid circuit of the input stage of the direct coupled amplifier will result in a change in the voltage between the output terminal pair 16, 16a as in a conventional integrating circuit. However, unlike the conventional circuit, such a change is reflected back to the junction 30 between the elements 27 and 28. There will now be components of the potential at the junction 30 representative of all sources of drift including that due to input current. All of these drift components can be detected at the junction 30 by the automatic balancing circuit and a correction will be introduced into the auxiliarly input stage 3 of the direct coupled amplifier which will counter the errors including that due to grid current flowing in the grid circuit of the primary input stage 2. In other words, any change in output voltage between the terminal pair 16, 16a which is not proportionally related to the input signal between the terminal pair 15, 15a will result in a voltage at the junction 30 of resistance 27 and capacitance 28, which voltage will be detected and corrected by the automatic balancing circuit.

For optimum operation of this particular embodiment, although this is not essential, the combined elements $R_1$, $C_1$ of the active integrating network and the combined elements $R_2$, $C_2$ of the passive network should have the same time constant. That is to say, the product of $R_1$ in megohms and $C_1$ in microfarads should be substantially equal to the product of $R_2$ in megohms and $C_2$ in microfarads. Of course, any other compatible system of units may be used for this calculation.

As an example of the improvement in operation of an analog integrator which may be effected with the use of my invention, the following is typical: A conventional analog integrator was selected which drifted 10 millivolts in approximately 100 seconds. A passive network according to my invention was patched in using components manufactured only to standard commercial tolerances. The new circuit was then noted to have a maximum drift of 0.4 millivolt over the same interval of time. Even better results may be obtained if greater care is taken to equate the time constant of the passive network with the time constant of the active integrator network.

It will be apparent to those skilled in the art that I have invented means for substantially improving the operation of electronic analog integrator circuits. Where it was previously extremely difficult to overcome the effects of grid current in the input stage of such circuit, it is now easily and economically possible with the aid of my invention to eliminate the effects of such current. While I have described but one embodiment of my invention and have applied it only to one particular type of integrator circuit, it will be apparent to those skilled in the art that many modifications of my invention may be made. Accordingly, I do not propose to be limited by the details of the particular embodiment described, but only by the scope of the subjoined claims.

I claim:

1. In electronic analog computing apparatus which includes a signal input terminal for the apparatus, a multi-stage, direct-coupled amplifier of the type having first and second input stages and an output circuit, each of said input stages having an input element and being adapted to control subsequent stages of said direct-coupled amplifier, a first plurality of impedances connected to provide an intermediate junction therebetween, said first plurality of impedances being connected between said signal input terminal and the output circuit of said direct-coupled amplifier and a connection between an intermediate junction of said first impedances and the input element of said first input stage, said first impedances being selected to form in combination with said direct-coupled amplifier an integrating amplifier, an automatic balancing circuit for said direct-coupled amplifier including an input terminal, a point of predetermined reference potential, and an alternating current amplifier having an input circuit and an output circuit, means for connecting the input circuit of the alternating current amplifier alternately to said input terminal of said balancing circuit and to said point of predetermined reference potential, and rectifying means connected between the output circuit of said alternating current amplifier and the input element of the second input stage of said direct-coupled amplifier; the improvement which comprises a second plurality of impedances connected to provide an intermediate junction therebetween, said second plurality of impedances being connected between the signal input terminal and the output circuit of said direct-coupled amplifier and a connection between an intermediate junction of said second impedances and the input terminal of said balancing circuit, the combination of said second impedances being selected to impress on the input terminal of said automatic balancing circuit a signal which is independent of differences between a signal impressed on the signal input terminal and the signal impressed on the input element of the first input stage of said direct-coupled amplifier.

2. In electronic analog computing apparatus which includes a signal input terminal for the apparatus, a multi-stage, direct-coupled amplifier of the type having first and second input stages and an output circuit, each of said input stages having an input element and being adapted to control subsequent stages of said multi-stage amplifier, a first input impedance connected between said signal input terminal and the input element of the first input stage of said multi-stage amplifier, a first feedback impedance connected between the output circuit and the first input stage of said multi-stage amplifier, said first input and feedback impedances being selected to form in combination with said multi-stage amplifier an integrating amplifier, an automatic balancing circuit for said multi-stage amplifier including an input terminal, a point of predetermined reference potential and an alternating current amplifier having an input circuit and an output circuit, means for connecting the input circuit of the alternating current amplifier alternately to said input terminal of said balancing circuit and to said point of predetermined reference potential, and rectifying means connected between the output circuit of said alternating current amplifier and the input element of the second input stage of said multi-stage amplifier; the improvement which comprises a second input impedance connected between the signal input terminal and the balancing circuit input terminal and a second feedback impedance connected between the output circuit of said direct-coupled amplifier and said balancing circuit input terminal, the combination of said second input and feedback impedances being selected to impress on the input terminal of said automatic balancing circuit a signal which is independent of differences between the signal impressed on the signal input terminal and the signal impressed on the input element of the first input stage of said direct-coupled amplifier.

3. The improvement in electronic analog computing apparatus according to claim 2 in which said first and second input impedances comprise resistances and said first and second feedback impedances comprise capacitances.

4. The improvement in electronic analog computing apparatus according to claim 2 in which the first and second input impedances are resistances $R_1$ and $R_2$, respectively, and the first and second feedback impedances are capacitances $C_1$ and $C_2$, respectively, and in which the product $R_1C_1$ is substantially equal to the product $R_2C_2$ in comparable units.

References Cited in the file of this patent

UNITED STATES PATENTS

| | | |
|---|---|---|
| 2,684,999 | Goldberg et al. | July 27, 1954 |
| 2,685,000 | Vance | July 27, 1954 |
| 2,714,136 | Greenwood | July 26, 1955 |